United States Patent [19]

Sikich et al.

[11] Patent Number: 4,695,981
[45] Date of Patent: Sep. 22, 1987

[54] INTEGRATED CIRCUIT MEMORY CELL ARRAY USING A SEGMENTED WORD LINE

[75] Inventors: Joseph P. Sikich; Richard R. Duncombe, both of Corvallis, Oreg.

[73] Assignee: Hewlett-Packard Company, Palo Alto, Calif.

[21] Appl. No.: 678,181

[22] Filed: Dec. 4, 1984

[51] Int. Cl.[4] .............................................. G11C 13/00
[52] U.S. Cl. .................................... 365/227; 365/226; 365/230
[58] Field of Search ............... 365/227, 230, 204, 226; 365/200 MS File

[56] References Cited

U.S. PATENT DOCUMENTS 3,141,153  7/1964  Klein ...................................... 365/73
3,803,554  4/1974  Bock et al. .......................... 365/227

FOREIGN PATENT DOCUMENTS 0090488  7/1981  Japan .................................... 365/230
0003785  1/1984  Japan .................................... 365/226

Primary Examiner—Terrell W. Fears
Attorney, Agent, or Firm—Douglas L. Weller

[57] ABSTRACT

A memory cell array with supporting circuitry is presented in accordance with the preferred embodiment of the present invention. Within the memory cell array, each wordline is segmented and each segment is selected accumulatively. Selecting segments accumulatively limits the average number of capacitors within the memory cells which are discharged per memory access, limiting power consumption and limits the attendant increase in chip complexity.

8 Claims, 6 Drawing Figures

INTEGRATED CIRCUIT MEMORY CELL ARRAY USING A SEGMENTED WORD LINE

BACKGROUND

The present invention relates to efficient design of cell arrays, particularly integrated circuit memory cell arrays.

FIG. 1 shows a prior design of a memory cell array with supporting circuitry. A power source 101 is coupled to a precharge array 102. Precharge array 102 is coupled to a memory cell array 106 through a series of column connector lines 104. Memory cell array 106 is coupled to a decoder 108 also through column connector lines 104. The contents of an addressed memory cell from memory cell array 106 appears on an output 109. The size of the array and the number of output lines within output 109 may vary. For example, if memory cell array 106 has 64 rows and 64 columns, decoder 108 could be a 64 to 1 decoder. On the other hand, if it is desired to address more than one memory cell at a time, then decoder 108 could be, for instance, a 64 by 8 decoder for 8-bit byte addressable memory or a 64 by 16 decoder for 16-bit word addressable memory.

FIG. 2 is a schematic of two memory cells within memory cell array 106. A memory cell 203 and a memory cell 204 of memory cell array 106 are used as examples to illustrate how memory cells within memory cell array 106 are addressed. A control line 103 turns on a transistor 201, a transistor 202 and also transistors for every column of memory cells within memory array 106. This charges a capacitor 205 within memory cell 203, a capacitor 206 within memory cell 204 and also capacitors within every memory cell within memory cell array 106. After the capacitors are charged control line 103 turns off transistors 201, 202 and also the transistors for every column of memory cells within array 106.

In order to select a row of memory cells, a word line corresponding to that row of memory cells is selected. For instance, a wordline 105 is selected which turns on a transistor 207, a transistor 208 and other transistors within memory cells within the selected row. Each memory cell stores a logic 1 or a logic 0. For instance, in FIG. 2 memory cells 203 and 204 are read only memory (ROM) cells. A terminal 210 of memory cell 204 is grounded so that when transistor 208 is turned on, capacitor 206 is discharged and a column line 104b of column lines 104 is at logic 0. On the other hand, a terminal 209 of memory cell 203 is open so that when transistor 207 is turned on, capacitor 205 remains charged and a column line 104a of column lines 104 is at logic 1. Column lines 104a and 104b and all other column lines within column lines 104 are then coupled into decoder 108 which selects one or more column lines within column lines 104 to couple to output 109 as described above.

The memory cell array design of FIG. 1 is not completely efficient. For instance, when selecting a row, transistors within all memory cells in that row are turned on, discharging many more capacitors than is necessary. FIG. 3 shows another prior design which uses power more efficiently.

In FIG. 3 is shown the memory cell array of FIG. 1 with additional circuitry to form a divided line arrangement. Divided lines 309, 310, 311, and 312 are coupled to wordline 105 through switches 301, 302, 303, and 304, respectively. Switches 301-304 are respectively coupled to an encoder 313 through enable lines 316-319. Address lines 314 and 315 select one enable line from enable lines 316-319. This in turn selects one switch from switches 301-304 and one divided line from divided lines 309-312.

In FIG. 4 switch 302 is shown to be, for instance, a Boolean "NAND" gate 401 coupled to a Boolean "NOT" gate 402. As can be seen, selecting only one divided line at a time limits the number of capacitors within the memory cells which are discharged for each memory access. This limits power consumption, however it also increases chip complexity.

SUMMARY

In accordance with the preferred embodiment of the present invention, a memory cell array with supporting circuitry is presented which is more power efficient than the memory cell array with supporting circuitry shown in FIGS. 1 and 2, and is less complex than the memory cell array and supporting circuitry shown in FIGS. 3 and 4. Each wordline in a memory cell array is segmented and each segment is selected accumulatively, as further described below. Selecting segments accumulatively limits the average number of capacitors within the memory cells which are discharged per memory access thereby limiting power consumption. Selecting segments accumulatively also limits the attendant increase in chip complexity.

DESCRIPTION OF THE PREFERRED EMBODIMENT

Figure 1:
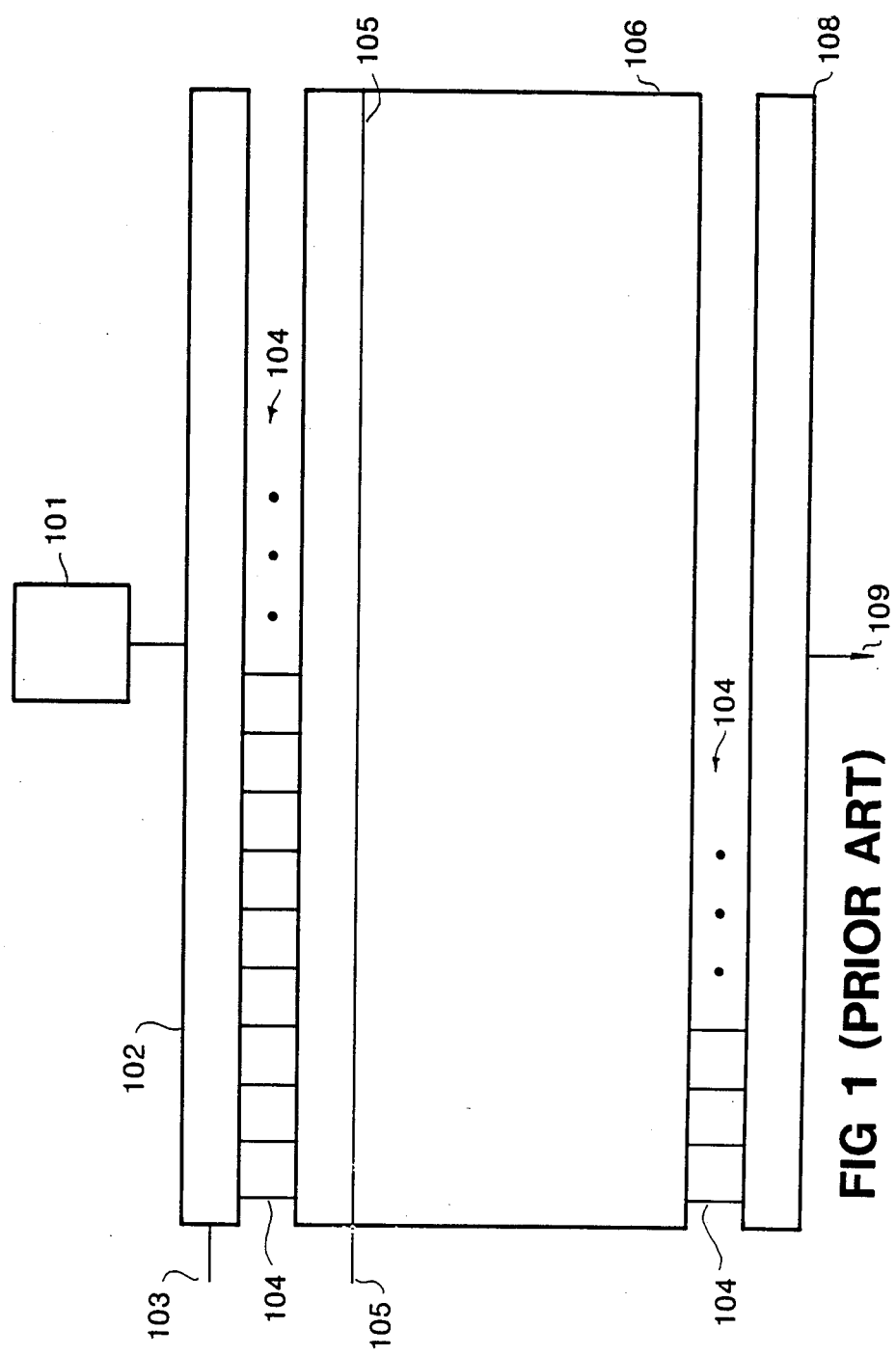
FIGS. 1 and 2 show a prior art memory cell array with supporting circuitry.
Figure 2:
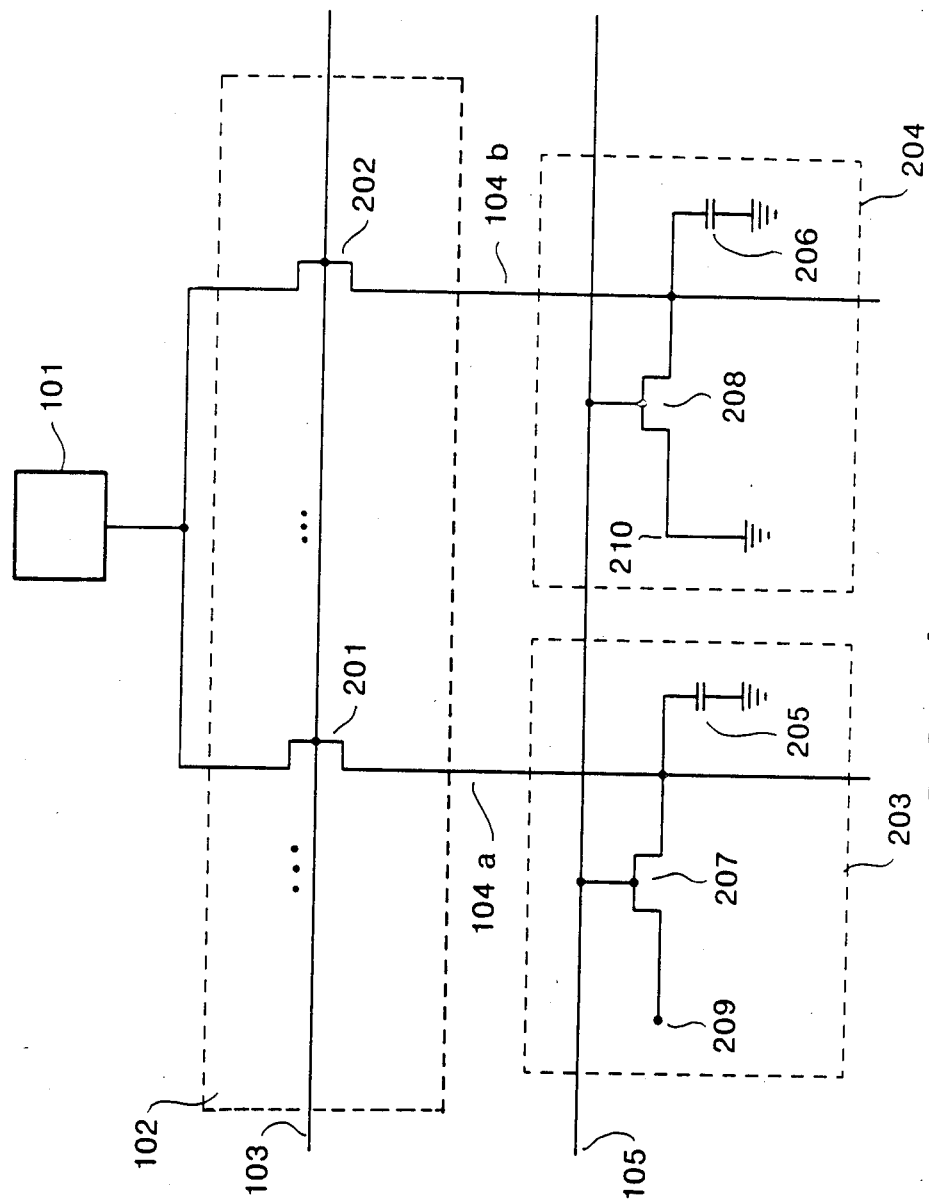
Figure 3:
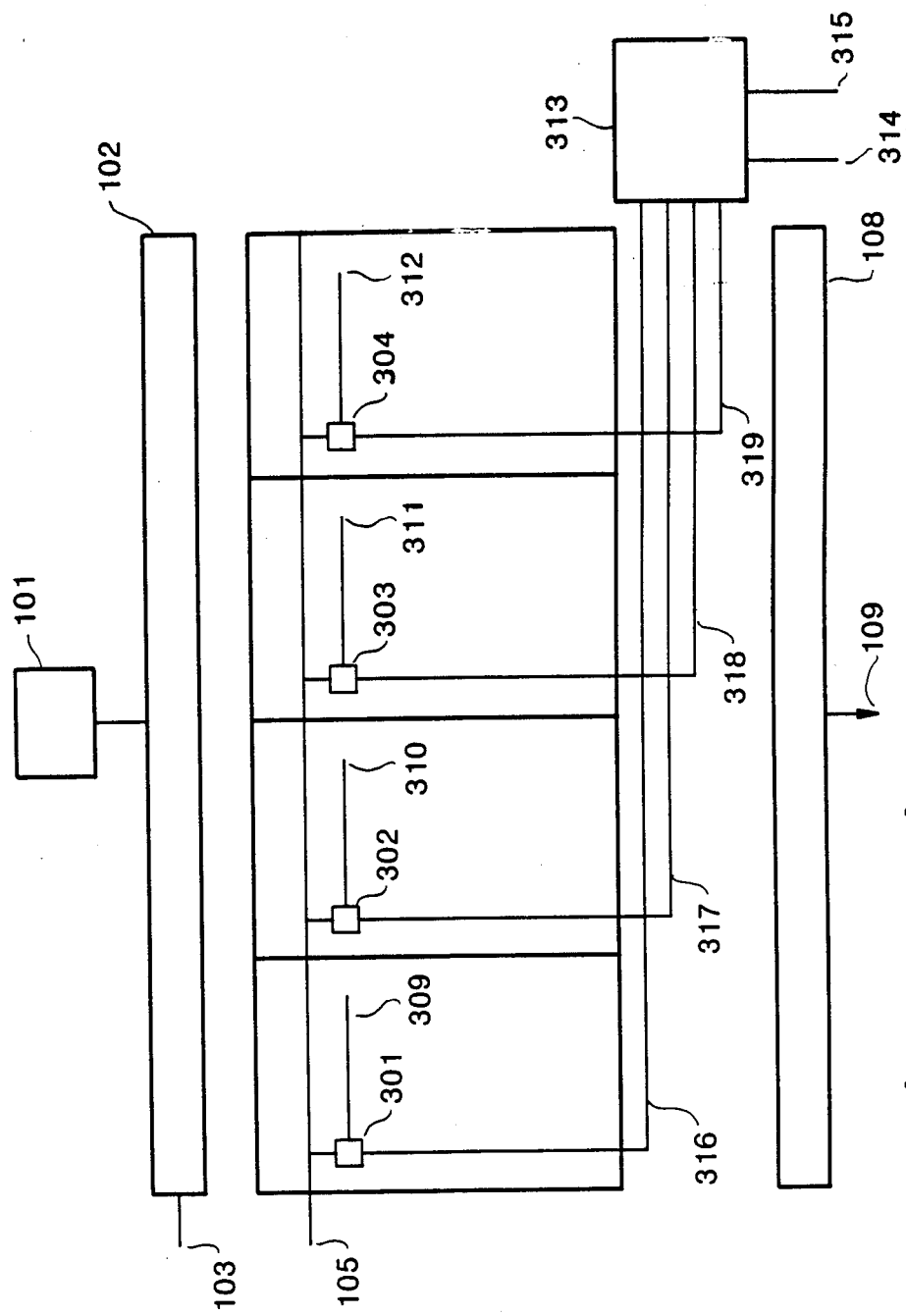
FIGS. 3 and 4 show another prior art memory cell array with supporting circuitry.
Figure 4:
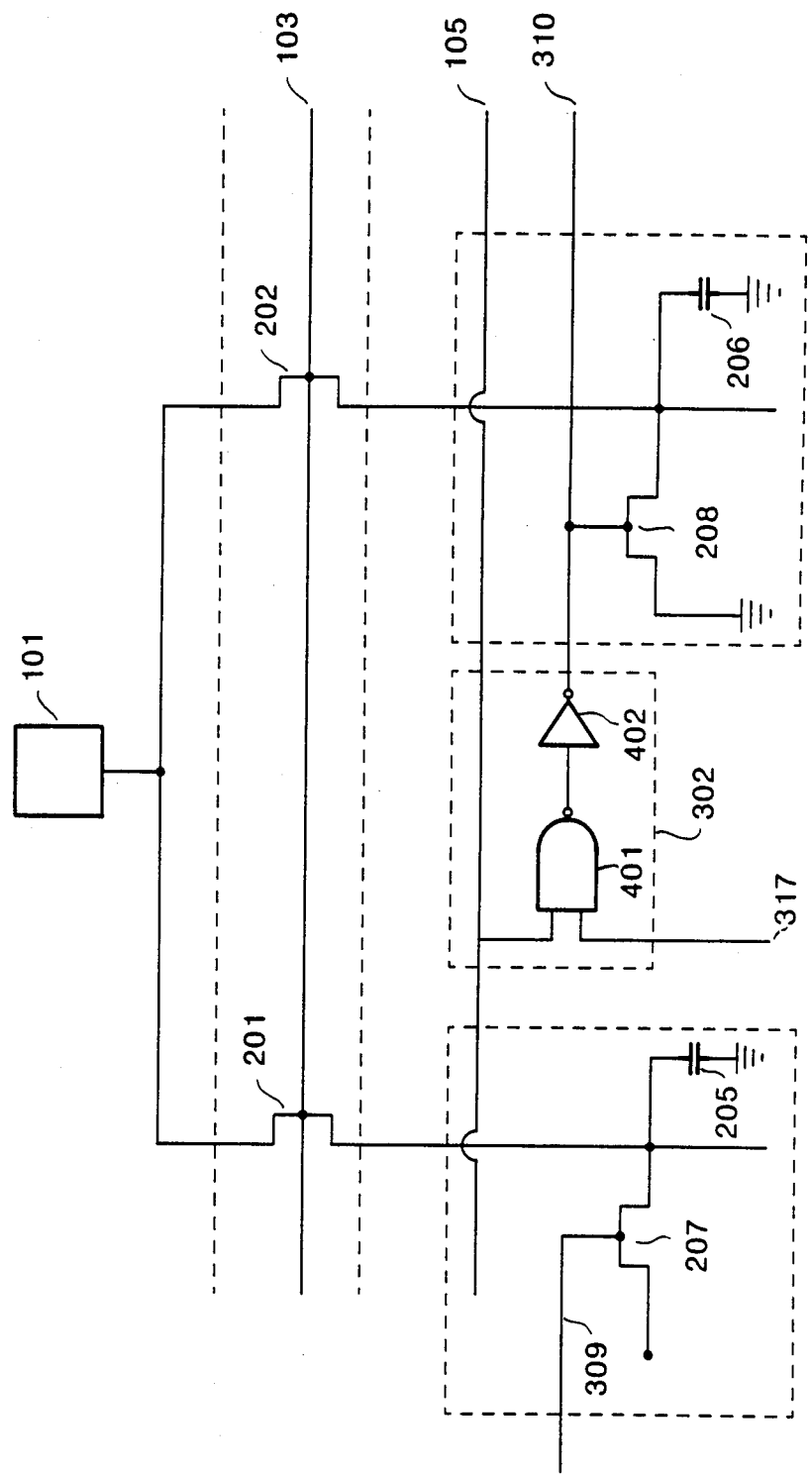
Figure 5:
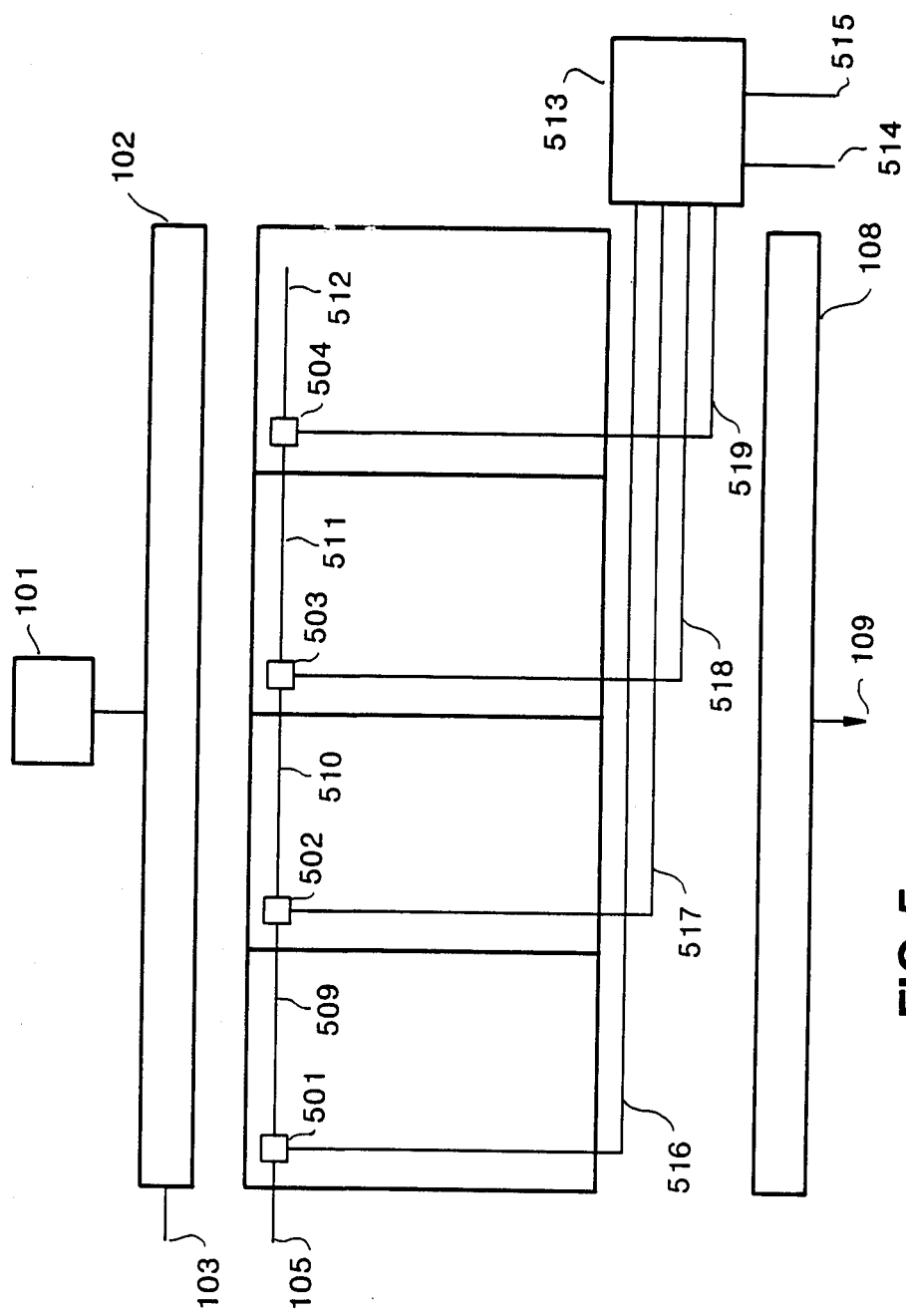
FIGS. 5 and 6 show a memory cell array with supporting circuitry in accordance with the preferred embodiment of the present invention.

In FIG. 5 is shown the memory cell array of FIG. 1 with additional circuitry to form a segmented line arrangement. Wordline 105 is shown segmented into segments 509, 510, 511, and 512 by switches 501, 502, 503, and 504. Switches 501-504 are respectively coupled to an encoder 513 through enable lines 516-519. Address lines 514 and 515 select accumulatively enable lines from enable lines 516-519. What is meant by select accumulatively is that when one enable line from enable lines 516-519 is selected all previous enable lines are selected. Thus, when enable line 516 is selected, no other enable lines are selected; when enable line 517 is selected, enable line 516 is also selected; when enable line 518 is selected, enable lines 516 and 517 are also selected, and when enable line 519 is selected, enable lines 516, 517, and 518 are also selected. In the same manner accumulative selection of enable lines 516-519 results in accumulative selection of switches 501-504 and thereby accumulative selection of segments 509-511.

Figure 6:
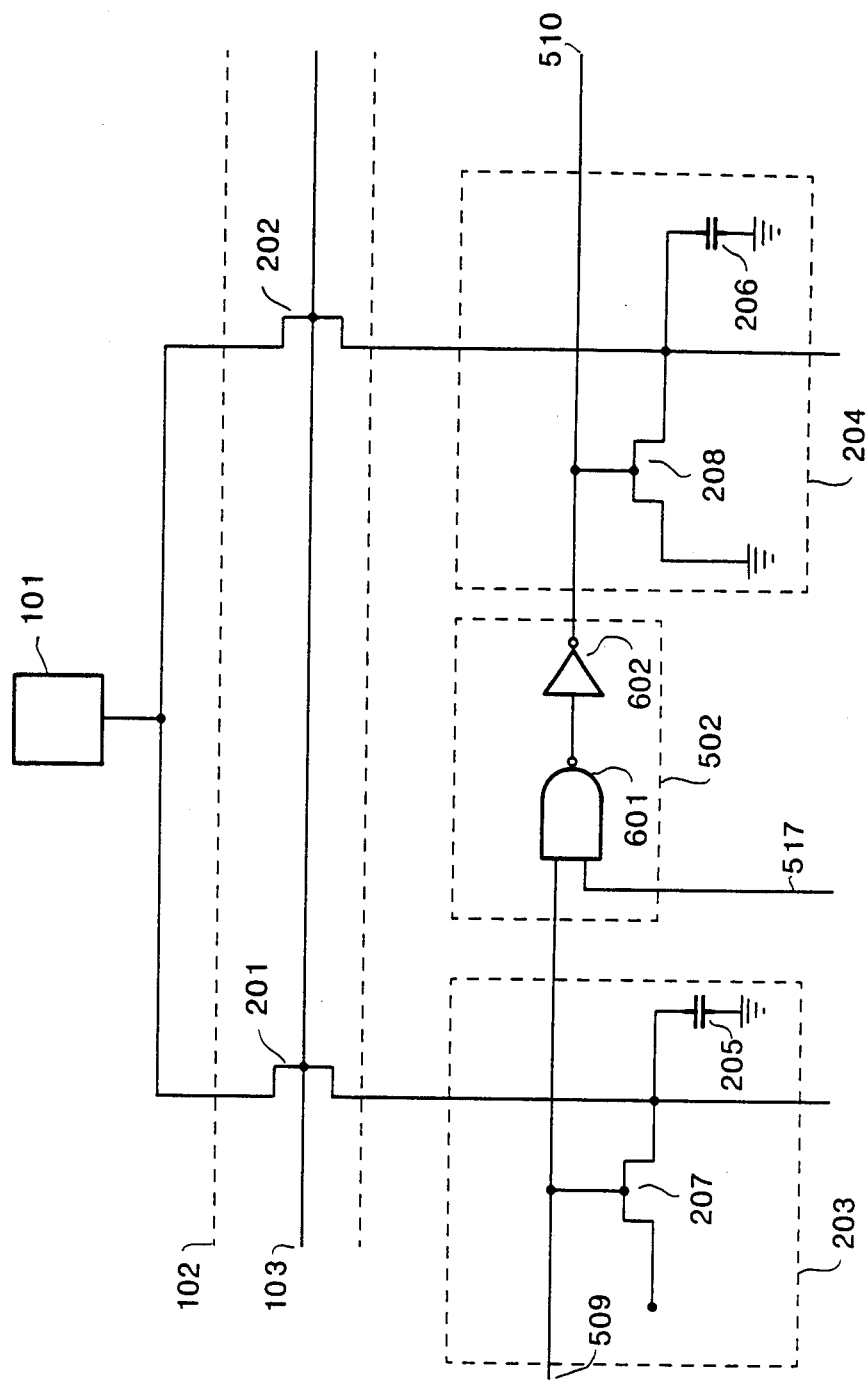

In FIG. 6 switch 502 is shown to be, for instance, a Boolean "NAND" gate 601 coupled to a Boolean "NOT" gate 602.

We claim:
1. A combination comprising:
   a plurality of cells arranged in an array, the array having a plurality of columns and a plurality of rows wherein each row in the plurality of rows has a plurality of segments;

row selection means for selecting cells within a first row of the plurality of rows; and, segment selection means for selecting cells within a segment of the first row wherein the segment selection means selects segments accumulatively.

2. A combination as in claim 1 additionally comprising column selection means for selecting cells within a first column of the plurality of columns.

3. A combination as in claim 2 wherein the combination occurs on an integrated circuit.

4. A combination as in claim 3 wherein the plurality of cells is a plurality of memory cells.

5. A combination comprising:

a plurality of cells arranged in an array, the array having a plurality of rows and a plurality of columns wherein each column in the plurality of columns has a plurality of segments;

column selection means for selecting cells within a first column of the plurality of columns; and, segment selection means for selecting cells within a segment of the first column wherein the segment selection means selects segments accumulatively.

6. A combination as in claim 5 additionally comprising row selection means for selecting cells within a first row of the plurality of rows.

7. A combination as in claim 6 wherein the combination occurs on an integrated circuit.

8. A combination as in claim 7 wherein the plurality of cells is a plurality of memory cells.

* * * * *